US011688650B2

(12) United States Patent
Shimoda et al.

(10) Patent No.: US 11,688,650 B2
(45) Date of Patent: Jun. 27, 2023

(54) ETCHING METHOD AND SUBSTRATE PROCESSING APPARATUS

(71) Applicant: Tokyo Electron Limited, Tokyo (JP)

(72) Inventors: Gaku Shimoda, Gyeonggi-do (KR); Masayuki Sawataishi, Miyagi (JP); Takanori Eto, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/918,359

(22) Filed: Jul. 1, 2020

(65) Prior Publication Data
US 2021/0005519 A1    Jan. 7, 2021

(30) Foreign Application Priority Data

Jul. 5, 2019 (JP) .................................. 2019-126424
Apr. 28, 2020 (JP) .................................. 2020-079687

(51) Int. Cl.
*H01L 21/311* (2006.01)
*H01L 21/66* (2006.01)
*H01L 21/3065* (2006.01)
*H01J 37/305* (2006.01)
(Continued)

(52) U.S. Cl.
CPC .......... *H01L 22/12* (2013.01); *H01J 37/3053* (2013.01); *H01J 37/32449* (2013.01); *H01L 21/3065* (2013.01); *H01L 21/67069* (2013.01); *H01L 21/67248* (2013.01); *H01L 21/67253* (2013.01)

(58) Field of Classification Search
CPC .......................... H01L 21/0234; H01L 21/311
See application file for complete search history.

(56) References Cited

U.S. PATENT DOCUMENTS

| | | | |
|---|---|---|---|
| 2004/0195216 A1* | 10/2004 | Strang .............. | H01J 37/32082 219/121.43 |
| 2015/0294880 A1* | 10/2015 | Anderson .............. | C07C 23/06 438/719 |
| 2018/0144986 A1* | 5/2018 | Zhang .............. | H01L 29/66795 |

(Continued)

FOREIGN PATENT DOCUMENTS

| | | |
|---|---|---|
| JP | 2014-090022 | 5/2014 |
| JP | 2019-036612 | 3/2019 |

OTHER PUBLICATIONS

"On the Behavior of the Sputtering using Various Kinds of Rare Gases under Radio-Frequency Plasma", written by Kanji Masui [Bulletin of Nagoya Institute of Technology, vol. 50 (1998) p. 141-146] with English abstract. Fig. 1 is related.

*Primary Examiner* — Thomas T Pham
(74) *Attorney, Agent, or Firm* — IPUSA, PLLC

(57) ABSTRACT

A method of etching a substrate, on which a multilayered film is formed, is provided. The multilayered film includes a silicon-containing insulating layer, an undercoat layer provided under the silicon-containing insulating layer, and a mask layer provided above the silicon-containing insulating layer. When the substrate is loaded into a process chamber, a process gas containing a fluorocarbon gas and a noble gas is supplied into the process chamber, and the multilayered film is etched by the plasma formed from the process gas. The noble gas contains a first gas having higher ionization energy than Ar gas, and momentum of an ionized particle of the first gas is less than momentum of an ionized particle of Ar gas.

12 Claims, 12 Drawing Sheets

(51) Int. Cl.
*H01L 21/67* (2006.01)
*H01J 37/32* (2006.01)

(56) References Cited

U.S. PATENT DOCUMENTS

| | | | |
|---|---|---|---|
| 2019/0109282 A1* | 4/2019 | Kubo | H01L 43/02 |
| 2019/0348279 A1* | 11/2019 | Zhang | H01L 21/0274 |
| 2020/0243336 A1* | 7/2020 | Chang | H01L 21/31116 |
| 2020/0365451 A1* | 11/2020 | Tien | H01L 21/76811 |

* cited by examiner

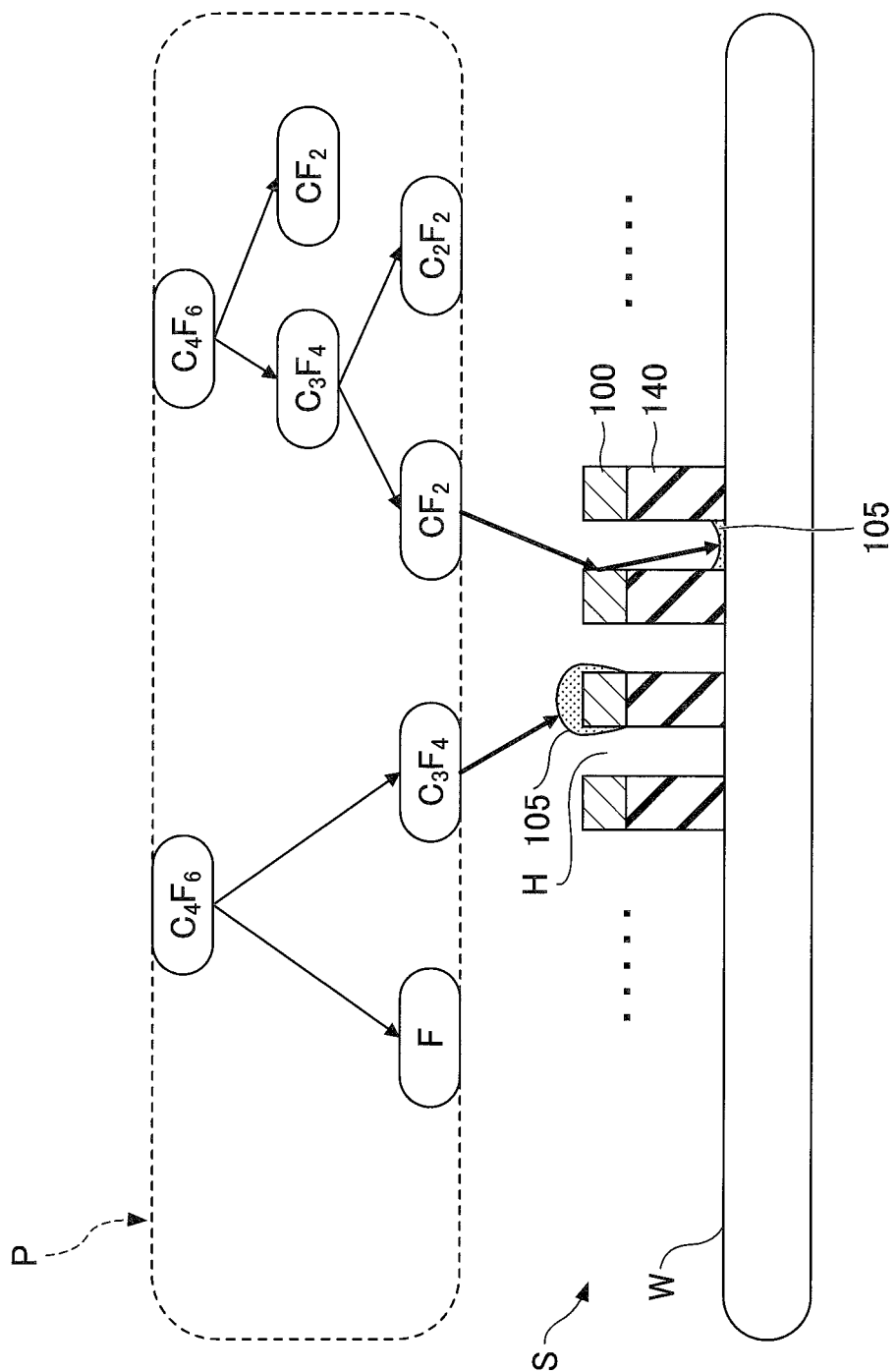

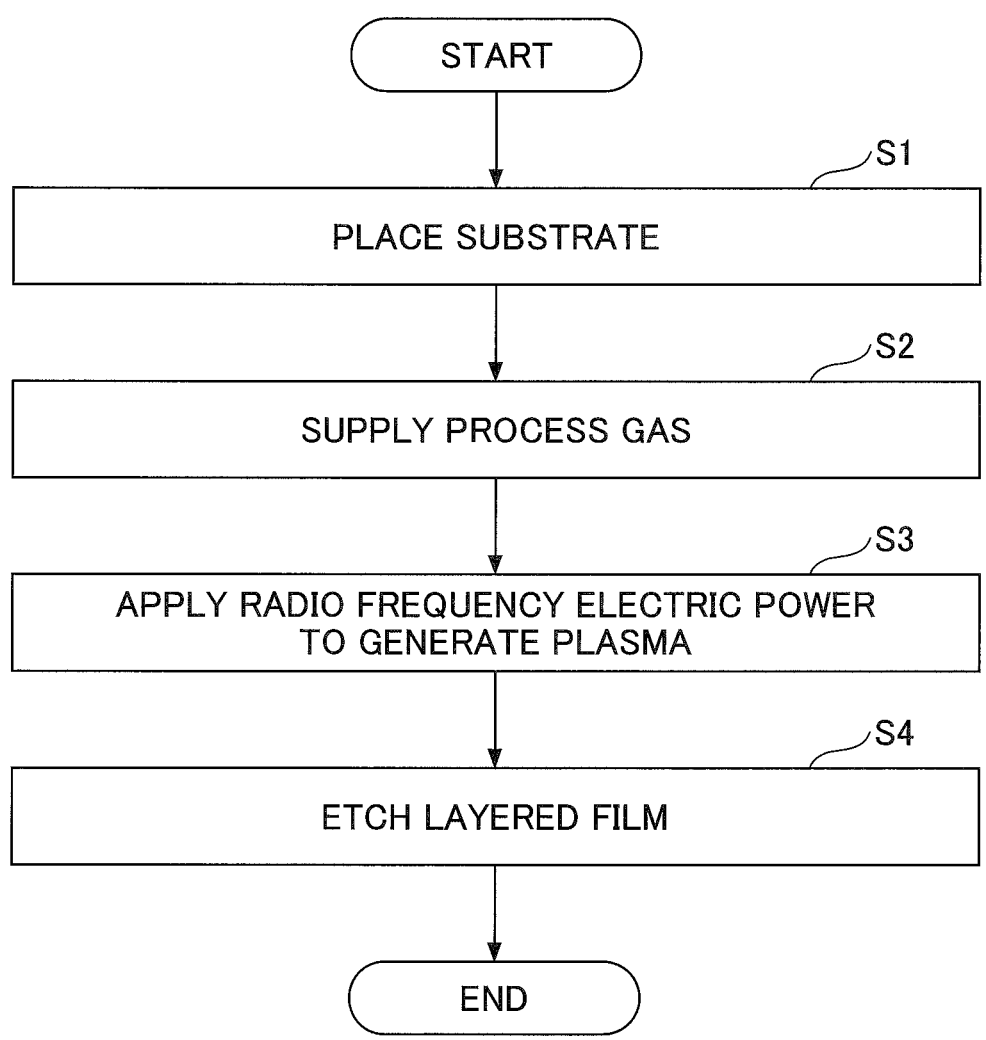

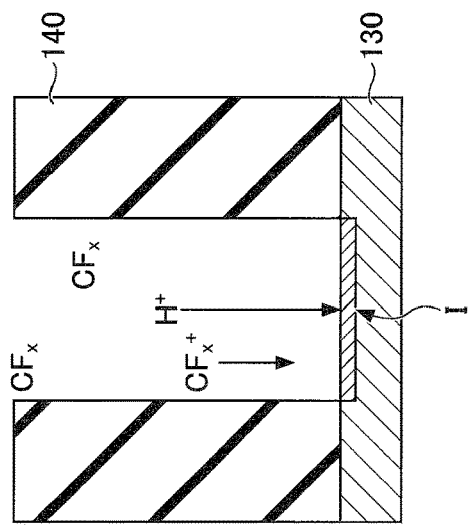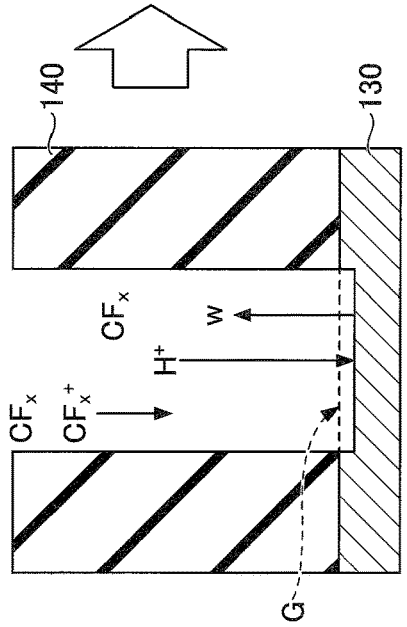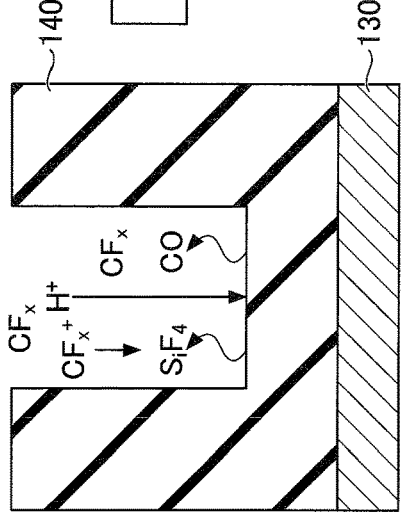

ETCHING METHOD AND SUBSTRATE PROCESSING APPARATUS

CROSS-REFERENCE TO RELATED APPLICATIONS

This patent application is based upon and claims priority to Japanese Patent Application No. 2019-126424 filed on Jul. 5, 2019, and Japanese Patent Application No. 2020-079687 filed on Apr. 28, 2020, the entire contents of which are incorporated herein by reference.

TECHNICAL FIELD

The present disclosure relates to an etching method and a substrate processing apparatus.

BACKGROUND

Fabrication of a three-dimensional multilayered semiconductor memory, such as a 3D-NAND flash memory, includes an etching process of forming multiple holes in a multilayered film by using a plasma. An example of the etching process for forming a 3D-NAND device structure includes the simultaneous and highly selective etching of a substrate silicon layer with respect to an intermediate metal layer when etching holes into a silicon oxide layer. In this etching process, a relatively shallow hole is formed to expose a metal layer located between the silicon oxide layers, and a deep hole is formed to expose a silicon layer below the metal layer. At this time, it is necessary to perform a process in which selectivity of the silicon oxide layer with respect to the base metal film is high. In addition to the 3D-NAND device structure, there is also a need for a process that increases selectivity of an etch target film with respect to an undercoat layer to reduce loss of the undercoat layer.

To ensure high selectivity, a protective film is formed on a tungsten layer using a process condition of high deposition property. For example, Patent Document 1 describes a plasma processing method in which a protective film can be formed on a surface of an etch-stop layer when an oxide layer is etched, and in which clogging of an opening of a hole can be suppressed.

Patent Document 2 describes a method of etching a multilayered film that achieves selectivity with respect to both a metal layer and a mask. In the method described in Patent Document 2, a process gas containing at least a fluorocarbon gas or a hydrofluorocarbon gas, oxygen, nitrogen, and CO is supplied into a processing vessel, and a plasma is generated in the processing vessel to etch the multilayered film.

RELATED ART DOCUMENTS

Patent Documents

[Patent Document 1] Japanese Laid-open Patent Application Publication No. 2014-090022
[Patent Document 2] Japanese Laid-open Patent Application Publication No. 2019-036612

SUMMARY

The present disclosure provides an etching method capable of improving selectivity of an etch target film to the undercoat layer.

According to one aspect of the present disclosure, a method of etching a substrate, on which a multilayered film is formed, is provided. The multilayered film includes a silicon-containing insulating layer, an undercoat layer provided under the silicon-containing insulating layer, and a mask layer provided above the silicon-containing insulating layer. The method includes loading the substrate into a process chamber; supplying a process gas containing a fluorocarbon gas and a noble gas into the process chamber; and forming a plasma from the process gas in the process chamber, thereby causing the multilayered film to be etched. The noble gas contains a first gas having higher ionization energy than Ar gas, and momentum of an ionized particle of the first gas is less than momentum of an ionized particle of Ar gas.

BRIEF DESCRIPTION OF THE DRAWINGS

FIG. 7 is a conceptual diagram explaining dissociation of $C_4F_6$ gas;

FIG. 13 is a flowchart illustrating the etching method according to the embodiment; and FIGS. 14A to 14C are diagrams for explaining the etching method according to the embodiment.

DETAILED DESCRIPTION OF EMBODIMENTS

Figure 1:
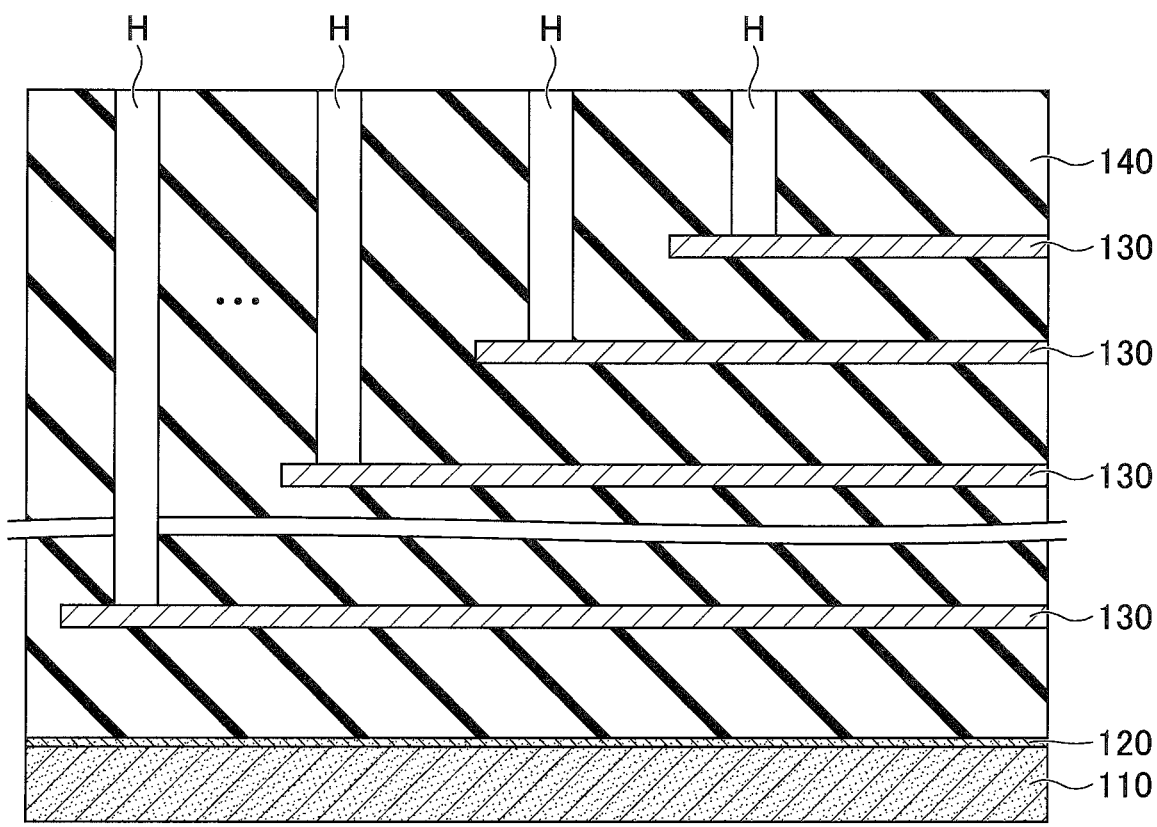
FIG. 1 is a diagram illustrating a multilayered film of a 3-D NAND flash memory.

Hereinafter, embodiments for carrying out the present disclosure will be described with reference to the drawings. In each drawing, the same components are indicated by the same reference numerals, and redundant descriptions may be omitted.

For example, in multi-level contacts (hereinafter referred to as "MLC"), which is a structure in 3D-NAND flash memory, tungsten (W) layers 130 serving as electrodes are formed in tiers at different depths, and silicon oxide ($SiO_2$) layers 140 on the tungsten (W) layers 130 are etched, as illustrated in FIG. 1. In this example, a set of the tungsten layers 130 and the silicon oxide layers 140 is a layered structure, and forms a multilayered film. The tungsten layers 130 may be a multi-layer structure, such as 60-200 layers.

In forming the MLC, the silicon oxide layers 140 are etched together to a depth of each of the tungsten layers 130 that are located at different depths above a silicon (Si) layer 110 and a silicon nitride (SiN) layer 120. As the generations of device structure progress, the number of layers increases, and an aspect ratio (AR) becomes very high. Therefore, depth loading becomes remarkable, and significant increase in etching time is expected.

Therefore, it is necessary to increase selectivity of the silicon oxide layer 140 to the tungsten layer 130 over a long etching time. Particularly, with respect to a tungsten layer 130 of the multiple tungsten layers 130 that is located at a shallow position, an etching time after the tungsten is exposed (over-etching time) is increased. Therefore, high selectivity of the silicon oxide layer 140 to the tungsten layer 130 is repaired. In addition, with respect to structures other than the MLC, a process having high selectivity of an etch target film to an undercoat layer is required, to reduce loss of the undercoat layer.

Accordingly, in the etching method according to the present embodiment, a process gas containing at least a fluorocarbon gas and a noble gas is supplied. Here, the noble gas includes a first gas that has higher ionization energy than Ar gas, and momentum of an ionized particle of the first gas is less than momentum of an ionized particle of Ar gas. A plasma is then generated in a processing vessel to which the first gas is supplied, to etch the multilayered film.

Immediately after the tungsten layer 130 is exposed by the silicon oxide layer 140 being etched, the tungsten layer 130 is bombarded with ions of the noble gas until a protective film is formed on the tungsten layer 130. However, the first gas included in the noble gas used in the present etching method is a gas having higher ionization energy than Ar gas, and momentum of an ionized particle of the first gas is less than momentum of an ionized particle of Ar gas. This allows sputter yield (sputtering yield) to be low, thus reducing loss of the tungsten layer 130. Further, because highly dissociated precursors having a low adsorption coefficient are produced, and a protective film is formed on the exposed tungsten layer 130, loss of the tungsten layer 130 can be further reduced.

Hereinafter, an etching method and a substrate processing apparatus according to the present embodiment will be described, in which an etching rate of the silicon oxide layer 140 as an etch target film is maintained while selectivity with respect to the tungsten layer 130 as an undercoat layer is improved.

It should be noted that, in the following description of the present embodiment, a case in which the first gas included in the noble gas used in the etching method is He gas is described. However, the first gas is not limited to He gas. The first gas may be a gas with higher ionization energy than Ar gas, and momentum of an ionized particle of the first gas may be less than that of an ionized particle of Ar gas.

Further, although the silicon oxide layer 140 is exemplified as an etch target film, the etch target film is not limited thereto, and may be a silicon-containing insulating layer. Other examples of the silicon-containing insulating layer include a silicon nitride layer, a multilayered structure of a silicon oxide layer and a silicon nitride layer, and a Low-k film layer such as organic-containing silicon oxide.

Further, although the tungsten layer 130 is exemplified as an undercoat layer of the etch target film, the undercoat layer is not limited thereto. The undercoat layer may be a conductive layer. Other examples of the conductive layer include a metal layer or a silicon layer. Examples of the metal layer include titanium (Ti), aluminum (Al), and copper (Cu) in addition to tungsten. Examples of the silicon layer include a silicon-containing layer having electrical conductivity, such as poly-Si or amorphous silicon.

Also, regarding processes applied to a structure other than the MLC, it may be desirable to have high selectivity of the etched film to the undercoat layer and to have less loss of the undercoat layer. With respect to the structure other than the MLC, an undercoat layer of an etch target film is not limited to a conductive layer such as a metal layer or a silicon layer. For example, it is desirable that loss of the undercoat layer is low, in a case of a self-aligned contact (SAC) structure having an etch target film of a silicon oxide film and an undercoat layer of a silicon nitride film, and in a case of a Via structure having an etch target film formed of at least one of a silicon oxide layer and a low-k film, and having an undercoat layer formed of at least one of a silicon carbide layer and a silicon carbide/nitride layer.

<Configuration of Substrate Processing Apparatus>

Figure 2:
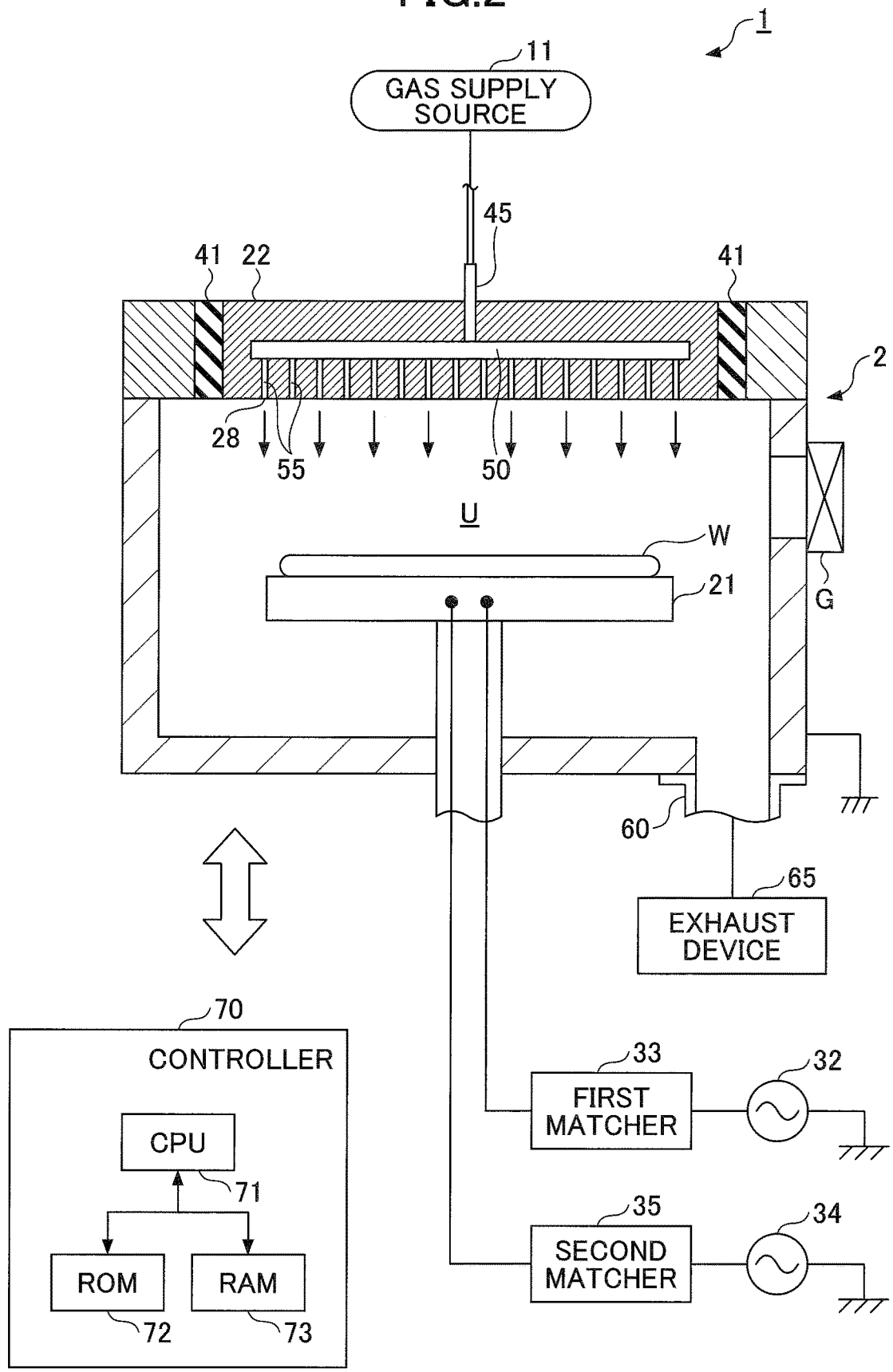
FIG. 2 is a diagram illustrating an example of the configuration of a substrate processing apparatus according to an embodiment.

First, an example of the configuration of the substrate processing apparatus that performs the etching method according to the present embodiment will be described with reference to FIG. 2. FIG. 2 is a diagram illustrating the example of the configuration of the substrate processing apparatus according to the present embodiment. Here, as an example of the substrate processing apparatus 1, a capacitively coupled plasma etching apparatus is described.

The substrate processing apparatus 1 includes a processing vessel (process chamber) 2 made of a conductive material, such as aluminum, and a gas supply source 11 for supplying gas to the interior of the processing vessel 2. The processing vessel 2 is electrically grounded. Inside the processing vessel 2, a lower electrode 21 and an upper electrode 22 oppositely disposed parallel thereto are included. The lower electrode 21 also functions as a mounting table (stage), on which a substrate W is mounted.

A first radio frequency power supply 32 is connected to the lower electrode 21 via a first matcher 33, and a second radio frequency power supply 34 is connected to the lower electrode 21 via a second matcher 35. The first radio frequency power supply 32 applies, to the lower electrode 21, first radio frequency electric power (radio frequency electric power HF for plasma generation) at a frequency in a range, for example, between 27 MHz and 100 MHz. The second radio frequency power supply 34 applies, to the lower electrode 21, second radio frequency electric power (radio frequency electric power LF for drawing ions) having a frequency ranging between, for example, 400 kHz to 13 MHz, which is lower than the frequency of the first radio frequency power supply 32.

The first radio frequency power supply 32 may be connected to the upper electrode 22 via the first matcher 33. The first radio frequency power supply 32 and the second radio frequency power supply 34 may synchronously or asynchronously output the first radio frequency electric power and the second radio frequency electric power intermittently, by switching magnitudes of the first radio frequency electric power and the second radio frequency electric power between off (0 W) and a maximum.

The first matcher 33 causes the internal impedance (or output impedance) of the first radio frequency power supply 32 to match the load impedance. The second matcher 35 causes the internal impedance (or output impedance) of the second radio frequency power supply 34 to match the load impedance. This causes the internal impedance and the load impedance to be apparently identical for each of the first and second radio frequency power supplies 32 and 34 while a plasma is being generated within the processing vessel 2.

The upper electrode 22 is fitted to the ceiling of the processing vessel 2 via a shield ring 41 covering an inner circumference of the ceiling. The shield ring 41 is made of an insulating material. The upper electrode 22 is provided with a gas inlet 45 that introduces a gas supplied from the gas supply source 11, and a diffusion chamber 50 that diffuses the introduced gas. Gas that is output from the gas supply source 11 is supplied to the diffusion chamber 50 via the gas inlet 45, and the gas introduced in the diffusion chamber 50 is supplied to a processing space U through gas flow passages 55 and holes 28. In this manner, the upper electrode 22 also functions as a gas showerhead.

A direct-current (DC) power supply (not illustrated) may be connected to the upper electrode 22. The DC power supply applies DC voltage to the upper electrode 22. The DC power supply may output voltage intermittently, by switching magnitudes of the voltage between off (0 V) and a maximum, synchronously or asynchronously with the first radio frequency power supply 32.

An exhaust port 60 is formed at the bottom of the processing vessel 2, and the inside of the processing vessel 2 is evacuated by an exhaust device 65 connected to the exhaust port 60. This allows the interior of the processing vessel 2 to be maintained at a predetermined quality of vacuum. A gate valve G is provided on the side wall of the processing vessel 2. The gate valve G opens and closes a loading/unloading port when loading a substrate W to the processing vessel 2 or unloading a substrate W from the processing vessel 2.

The substrate processing apparatus 1 is provided with a controller 70 that controls an overall operation of the substrate processing apparatus 1. The controller 70 includes a CPU 71, a ROM 72, and a RAM 73. A basic program that is executed by the controller 70 is stored in the ROM 72. Recipe data is stored in the RAM 73. In the recipe data, control information of the substrate processing apparatus 1 with respect to a process condition (e.g., an etching condition) is recorded. Examples of the control information may include process time, pressure (of gas exhaust), radio frequency electric power and voltage, flow rates of various gases, and a temperature in a chamber (e.g., substrate temperature). The recipe data may be stored in a hard disk or a semiconductor memory. Also, the recipe may be stored in a computer-readable removable storage medium such as a CD-ROM or a DVD, and the removable storage medium may be loaded in a predetermined place in an accessible state.

The CPU 71 controls an entirety of the substrate processing apparatus 1 based on the basic program stored in the ROM 72. The CPU 71 controls supply of a predetermined type of gas in accordance with a procedure prescribed in the recipe data stored in the RAM 73, and controls a desired process applied to the substrate W, such as an etching process.

<Optimization of Process Gas>

Next, in the etching method performed by using the substrate processing apparatus 1, an optimization method of a process gas that can achieve both maintaining an etching rate of the silicon oxide layer 140 and improving selectivity of the silicon oxide layer 140 with respect to the tungsten layer 130 as the undercoat layer will be described. In the present embodiment, a substrate W having a multilayered film on the surface of a silicon layer 110 of the substrate W is processed. The multilayered film is formed by sequentially forming a tungsten layer 130, a silicon oxide layer 140, and a mask layer 100 (see FIG. 8).

In the etching method according to the present embodiment, the process gas contains at least fluorocarbon gas and noble gas. The method includes a step of supplying the process gas and a step of generating a plasma in the process space U in which the process gas is supplied, to etch the multilayered film.

The fluorocarbon gas used may be at least one of $C_4F_6$, $C_4F_8$, $C_3F_8$, $C_6F_6$, and $C_5F_8$ gases.

Ionization energy of He gas is "2372.3 (kJ/mol)", which is greater than that of Ar gas "1520.6 (kJ/mol)". Thus, a case in which the noble gas to be used is He gas will be described, which is an example of a first gas whose ionization energy is higher than that of Ar gas, and momentum of an ionized particle of which is less than that of an ionized particle of Ar gas. However, the first gas is not limited to He gas. For example, Ne (neon) gas, which has ionization energy of "2080.7 (kJ/mol)", may be used. Alternatively, a mixture of He gas and Ne gas may be used. The first gas may be a mixture of Ar gas and at least one of He gas and Ne gas. The characteristic of the first gas that "momentum of an ionized particle of the first gas is less than that of an ionized particle of Ar gas" will be described below.

The process gas may include $O_2$ gas, CO gas, $N_2$ gas, or $H_2$ gas, in addition to the above-mentioned fluorocarbon gas and noble gas. Alternatively, a halogen-containing gas, such as $Cl_2$, HBr, $CF_4$, $CHF_3$, or $NF_3$ may be included.

<Selection and Effect of Gas Species in Etching Method Processes>

Figure 3:
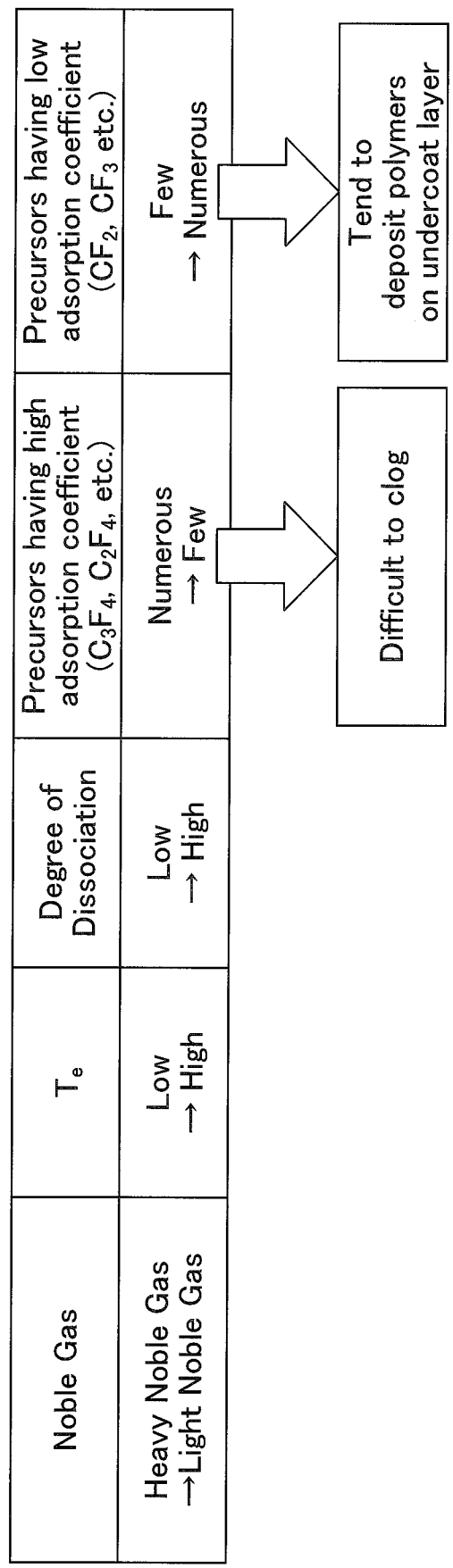
FIG. 3 is a diagram illustrating selection and effect of gas species in an etching method according to the embodiment.

Next, selection and effect of a gas type in the etching method according to the present embodiment will be described with reference to FIG. 3. FIG. 3 is a diagram illustrating the selection and effect of gas species in the etching method according to the present embodiment.

In the etching method according to the present embodiment, fluorocarbon gas to be used is $C_4F_6$ gas, and the noble gas to be used is He gas. In the comparative example, the fluorocarbon gas to be used is $C_4F_6$ gas and the noble gas to be used is Ar gas. That is, the noble gas used in the etching method according to the present embodiment is changed from Ar gas used in the comparative example to He gas, which is lighter than Ar gas. Ar gas is an example of a heavy noble gas, and He gas is an example of a light noble gas because He gas is lighter than Ar gas.

Figure 4:
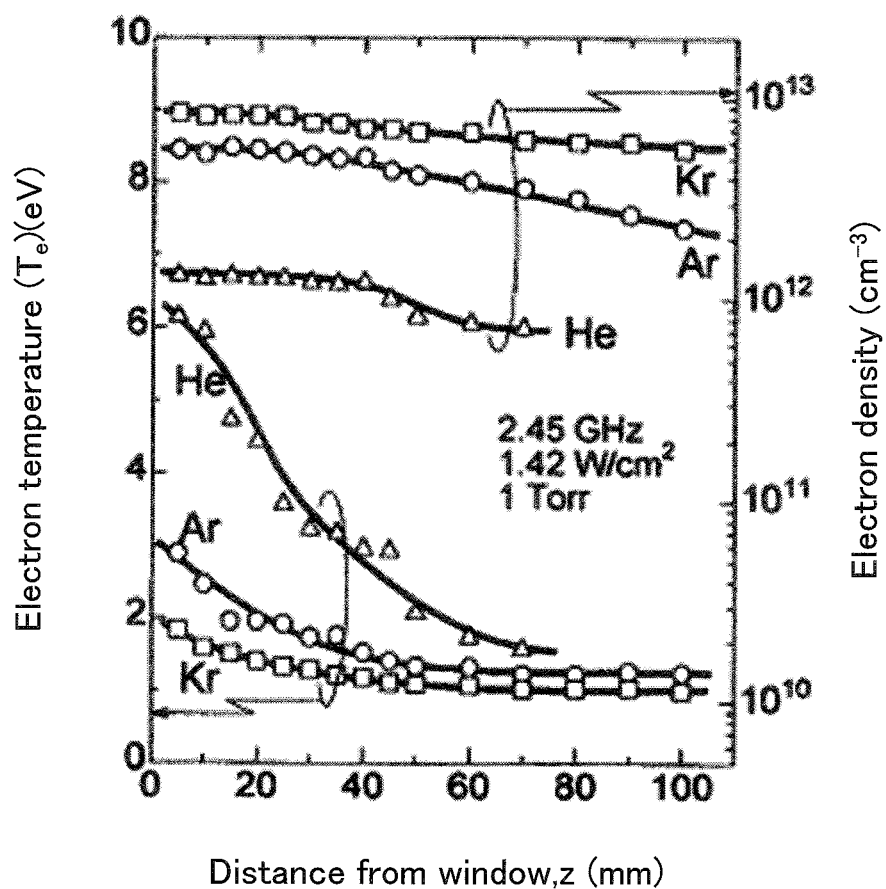
FIG. 4 is a diagram illustrating a relationship between plasma electron density and plasma electron temperature for each noble gas.

FIG. 4 is a diagram illustrating a relationship between plasma electron density and plasma electron temperature for each noble gas. The horizontal axis of FIG. 4 indicates a distance from a microwave window from which microwave power of 2.45 GHz is introduced, a vertical axis on the right side indicates plasma electron density (Ne), and a vertical axis on the left side indicates plasma electron temperature (Te). The graph of FIG. 4 indicates that changing a type of the noble gas to be used from Ar gas to He gas decreases the plasma electron density and increases the plasma electron temperature (Te). The reason will be described in the following.

Ionization energy of He gas is "2372.3 (kJ/mol)", which is greater than the ionization energy of Ar gas, "1520.6 (kJ/mol)". Ionization energy means energy required to ionize by removing an electron from an atom or molecule, and He gas requires higher energy than Ar gas to remove an electron from the outermost electron shell of the atomic orbital. Therefore, because He gas is more difficult to be ionized than Ar gas, He gas has lower plasma electron density than Ar gas. As the plasma electron density decreases, temperature that is given per particle in the plasma increases. As a result, as illustrated in FIG. 4, when a type of the noble gas to be used is changed from Ar gas, an example of heavy noble gas, to He gas, an example of light noble gas, the plasma electron density decreases and the plasma electron temperature rises.

Figure 5:
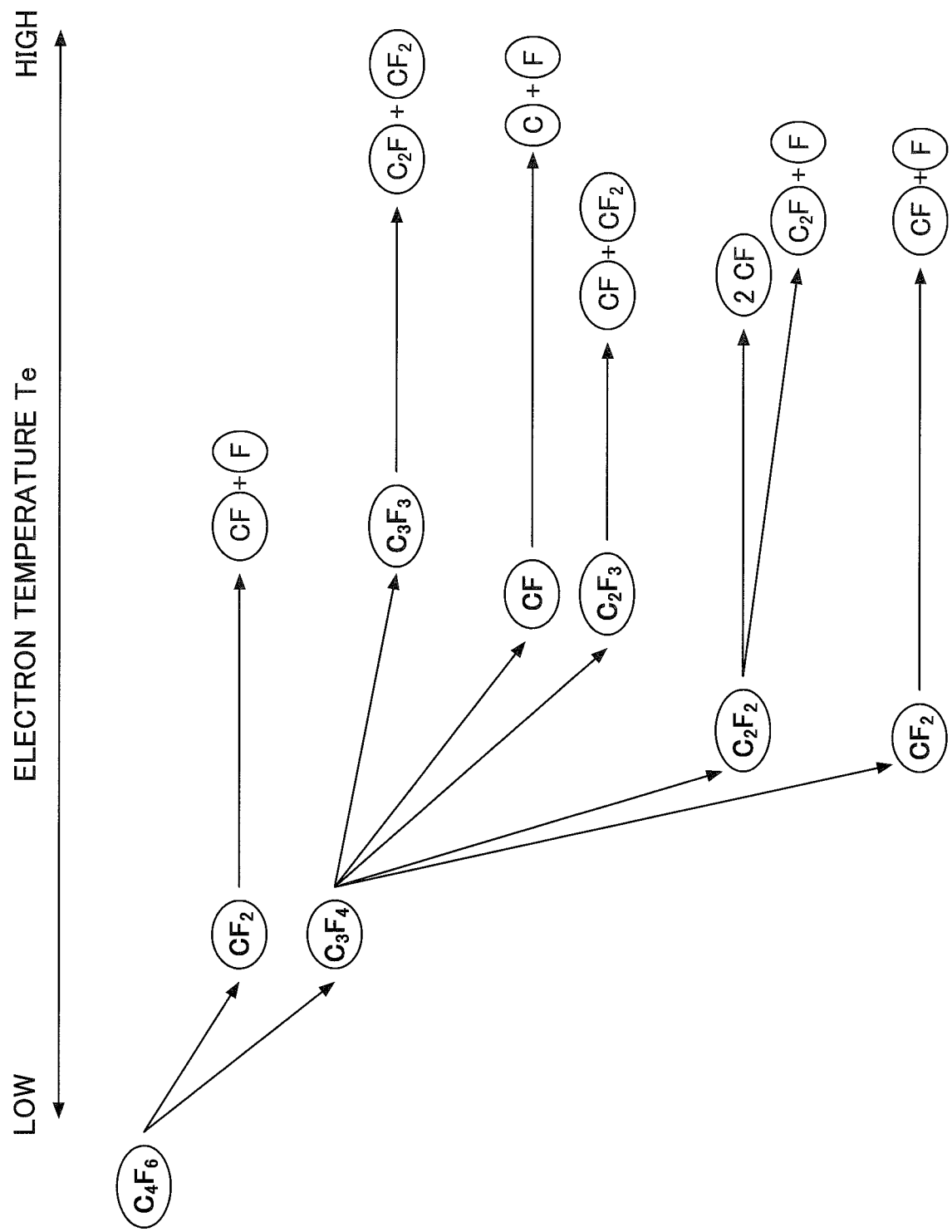
FIG. 5 is a diagram illustrating a relationship between degrees of dissociation of $C_4F_6$ gas and plasma electron temperature.
Figure 6:
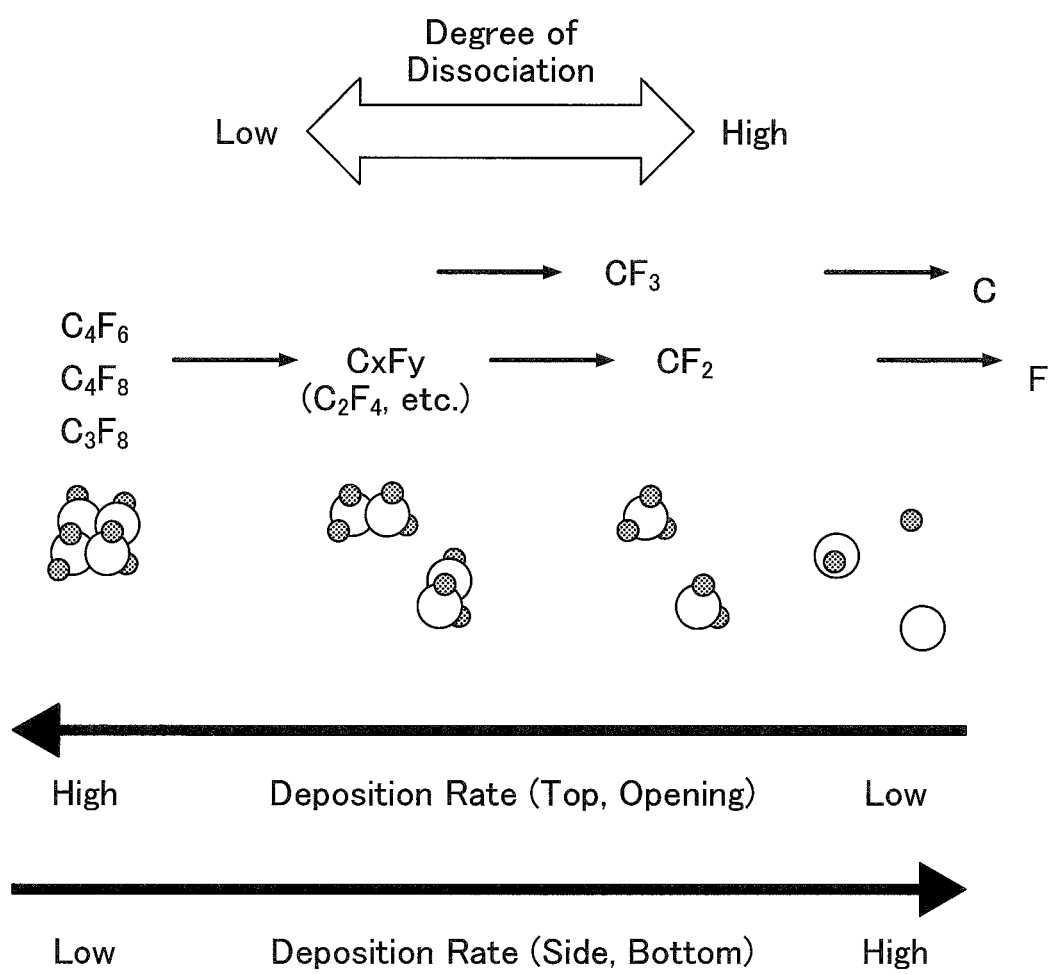
FIG. 6 is a conceptual diagram illustrating a relationship between the degree of dissociation and a deposition rate.

As the plasma electron temperature rises, energy of one electron rises, so that when electrons collide with a gas, the gas is more likely to become dissociated, and precursors, such as highly dissociated radicals and further ionized ions, are more likely to be formed. The precursor produced contributes to deposition of polymers. The radical precursor acts isotropically to the substrate W from the plasma, and the ionic precursor acts anisotropically. Also, the precursors deposited on an etch target film contribute as etchant that promotes etching of the etch target film by interacting with noble gas ions drawn into the substrate W by the RF power LF. FIG. 5 is a diagram illustrating a relationship between degrees of dissociation of $C_4F_6$ gas and plasma electron temperature. The horizontal axis of FIG. 5 indicates plasma electron temperature. When the plasma electron temperature is low, dissociation of $C_4F_6$ gas is difficult to accelerate, and there are many precursors with low dissociation ($C_3F_4$ radicals, $C_3F_4^+$ ions, etc.), and few precursors with high dissociation ($CF_2$ radicals, $CF_2^+$ ions, etc.). As the plasma electron temperature increases, dissociation of the $C_4F_6$ gas is promoted. Thus, highly dissociated CF radicals increase, and precursors of low dissociation decreases. Thus, by switching a noble gas from a heavy noble gas to a light noble gas, low dissociation precursors in the plasma decrease and high dissociation precursors in the plasma increase. In other words, if a noble gas is changed from a heavy noble gas to a light noble gas, precursors having a high adsorption coefficient (adsorption force) such as $C_3F_4$ decrease, and precursors having a low adsorption coefficient such as $CF_2$ increase. However, as illustrated in FIGS. 6 and 7, both high-dissociation precursors and low-dissociation precursors exist in a plasma generation region P formed in the process space U. By changing the noble gas used for etching from Ar gas to He gas, a ratio of high-dissociation precursors to low-dissociation precursors varies. Specifically, an amount of precursors with high dissociation and low adsorption coefficient can be relatively greater than an amount of precursors with low dissociation and high adsorption coefficient. The precursors generated in the plasma generation region P are supplied to the substrate W through a sheath region S.

Precursors that are in an intermediate stage between low dissociation and high dissociation, such as $C_2F_2$ radicals and $C_2F^+$ ions, have intermediate characteristics between low dissociation precursors and high dissociation precursors. Although examples of dissociation of $C_4F_6$ gas are illustrated in FIG. 5, dissociation of other fluorocarbon gases than $C_4F_6$ gas, such as $C_4F_8$ as, $C_3F_8$ gas, $C_6F_6$ gas, and $C_5F_8$ gas, is also promoted by raising the plasma electron temperature. Depending on a type of gas to be used, precursors such as $CF_3$ radicals and $CF_3^+$ ions are generated.

Figure 8B:
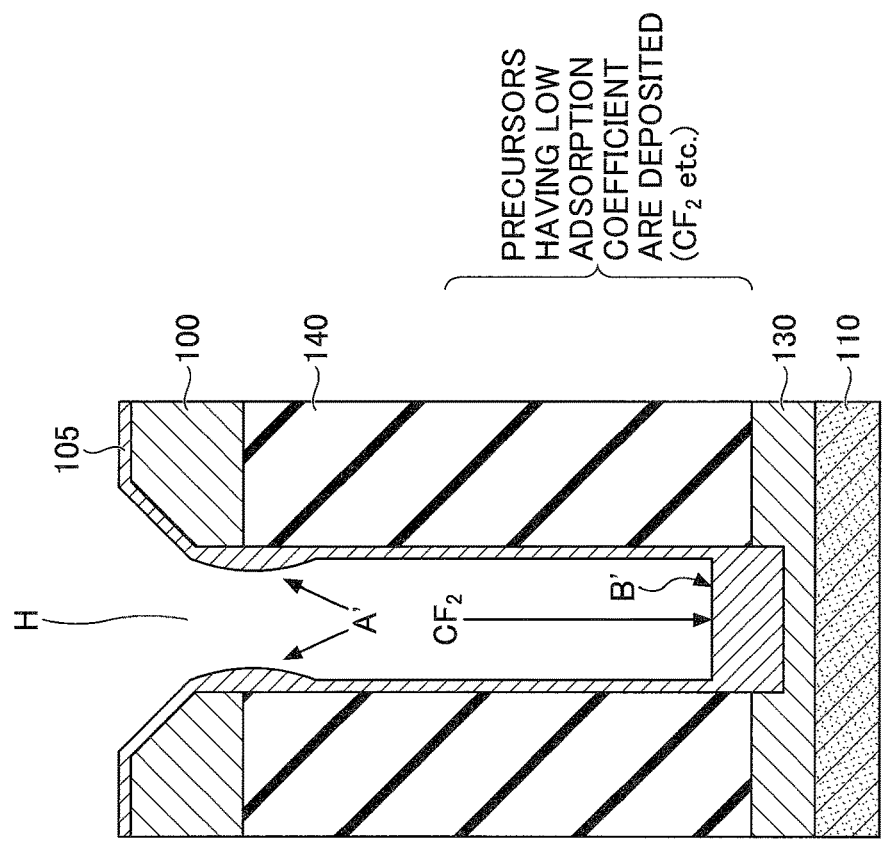
FIGS. 8A and 8B are diagrams explaining how deposition tendency is changed in accordance with an adsorption coefficient of polymers.
Figure 8A:
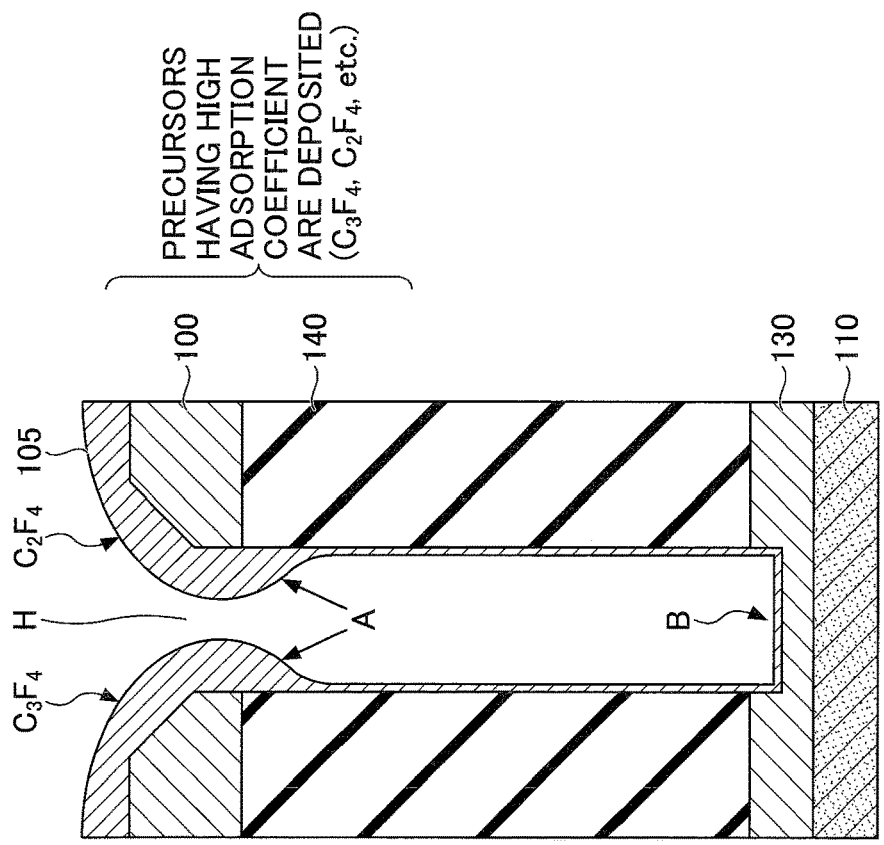

As described above, a low dissociation precursor has a high adsorption coefficient, and is prone to adhere to an upper surface of the mask layer 100 or an upper portion (side surface) of an opening of a hole of the mask layer 100, as indicated by an arrow directed from "$C_3F_4$" to the sheath region S in FIG. 7, which represents behavior of $C_3F_4$. Thus, low dissociation precursors are consumed at the upper surface of the mask layer 100 and the upper portion of the side surface of the mask layer 100 to form polymers 105, and do not readily reach the bottom surface or a lower portion of the side surface of the hole H formed in the silicon oxide layer 140. As illustrated in FIG. 8A or 8B, the mask layer 100 is formed on the silicon oxide layer 140, and may be an organic film or other materials.

In contrast, a highly dissociated precursor has a low adsorption coefficient, and does not readily adhere to the upper surface or the upper portion of the side surface of the mask layer 100, as indicated by an arrow in FIG. 7 originating at $CF_2$ and directed to the sheath region S, which represents behavior of $CF_2$. As a result, highly dissociated precursors are not consumed at the upper surface or the upper portion of the side surface of the mask layer 100, and easily reach the bottom surface and a lower portion of the side surface of the hole H formed in the silicon oxide layer 140, as indicated by an arrow illustrated in the hole H, which is oriented downward. Therefore, compared to low dissociated precursors, highly dissociated precursors are more likely to form the polymers 105 on the bottom surface and the lower portion of the side surface of the hole formed in the silicon oxide layer 140.

As described above, highly dissociated precursors having a low adsorption coefficient do not readily adhere to the upper surface or the upper portion of the side surface of the mask layer 100, and are likely to adhere to the bottom surface and the lower portion of the side surface of the hole H. Therefore, as illustrated in FIG. 3, by reducing low dissociated precursors having a high adsorption coefficient, and by increasing highly dissociated precursors having a low adsorption coefficient, clogging of the hole is less likely to occur, and a large amount of precursors can be supplied to the tungsten layer 130 exposed at the bottom of the hole. To this end, it is important to optimize process conditions to facilitate dissociation of $C_4F_6$ gas, in order to reduce low dissociated radicals such as $C_2F_4$ and $C_2F_3$, and to increase highly dissociated radicals such as $CF_2$ and CF.

For this reason, in the etching method according to the present embodiment, He gas having smaller mass than Ar gas is used as the noble gas. This can reduce precursors having a high adsorption coefficient and increase precursors having a low adsorption coefficient.

Further described with reference to the multilayered films illustrated in FIGS. 8A and 8B, as the number of low-dissociated precursors such as $C_2F_4$ and $C_3F_4$ increases, the polymers 105 tend to be deposited on the upper surface and the opening (side surface) of the mask layer 100, and a hole formed in the mask layer 100 and the silicon oxide layer 140 is easily occluded, as illustrated in FIG. 8A (see arrows "A"). Further, because the precursors are consumed at the upper surface and the side surface of the mask layer 100, few precursors reach the tungsten layer 130 at the bottom of the hole H or a lower portion of the side surface of the hole H, and thus the polymers 105 are less likely to be deposited on the tungsten layer 130 (see an arrow "B").

As the plasma electron temperature increases, $C_4F_6$ gas tends to dissociate, precursors with a higher adsorption coefficient increase, and precursors with a lower adsorption coefficient decrease. As a result, the polymers 105 are less likely to be deposited on the upper surface or opening of the mask layer 100, and clogging of the hole H is less likely to occur (see arrows A'), as illustrated in FIG. 8B. Further, an amount of precursors that are consumed on the upper or side surface of the mask layer 100 decreases, and more precursors reach the lower portion of the side surfaces of the hole H or the tungsten layer 130 at the bottom of the hole H, so that a large amount of polymers 105 is deposited on the tungsten layer 130 (see an arrow B').

As a result, compared to the comparative example in which Ar gas is used as the noble gas, the etching method according to the present embodiment, in which He gas is used as the noble gas, prevents the upper part of the opening of the etched hole H from being clogged, and causes CF-based radicals to easily reach the bottom of the hole H. As a result, because etchant can be supplied sufficiently, the etching rate of the silicon oxide layer 140 can be maintained. In addition, on the tungsten layer 130 which is an undercoat layer of the silicon oxide layer 140, as the polymers 105 are formed as a protective film, selectivity of the silicon oxide layer 140 to the tungsten layer 130 can improve.

As a result, loss of the undercoat layer can be suppressed (damage to the undercoat layer is reduced). Further, by suppressing occurrence of clogging of the upper portion of the opening of the hole H, an etching profile of the silicon oxide layer 140 can be made perpendicular without bowing. Further, by suppressing the occurrence of clogging to assure a size of the opening of the hole H, an amount of precursors and ions of noble gas entering the opening of the hole H increases, and as a result, the amount of precursors and ions of noble gas reaching the bottom of the hole H increases. Therefore, as etching of an etch target film is promoted, throughput is improved, and the polymers 105 as a protective film are formed more effectively.

<Experimental Results>

Figure 9:
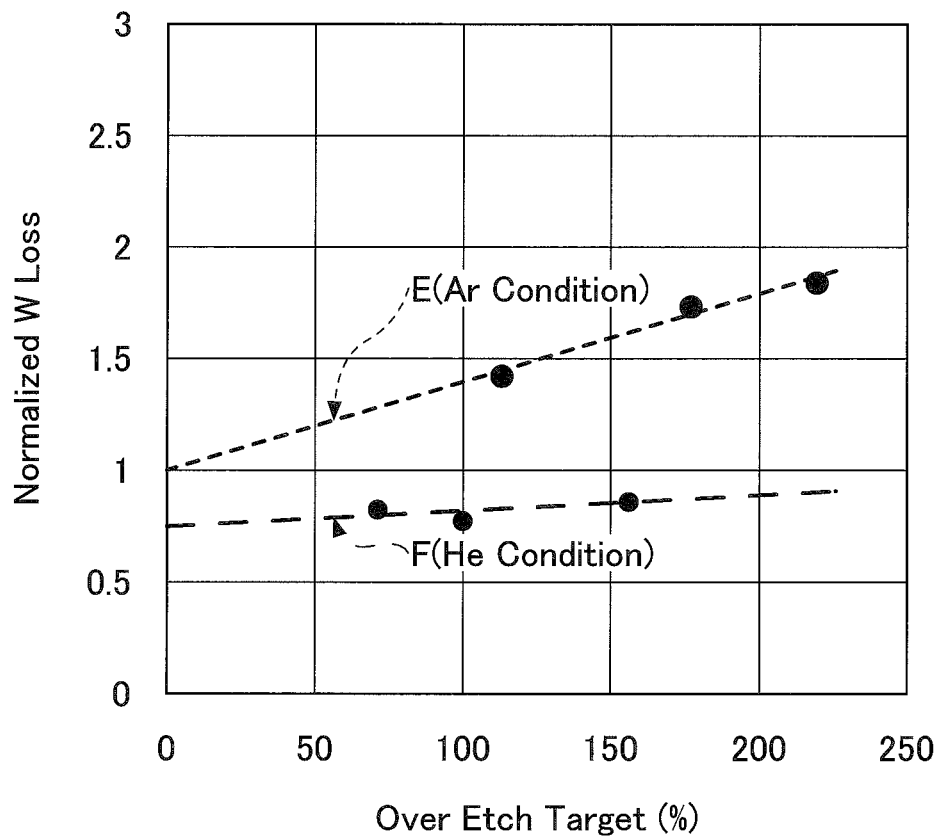
FIG. 9 is an experimental result illustrating a relationship between loss of a tungsten layer and types of noble gas that are used in the etching method according to the embodiment.

FIG. 9 is an experimental result illustrating a relationship between loss of the tungsten layer 130 and types of noble gas that are used in the etching methods according to the present embodiment and the comparative example. With respect to process conditions in the etching methods according to the embodiment and the comparative example, radio frequency electric power, pressure in the processing vessel, and process gases other than the noble gas were the same. Line E indicates loss of the tungsten layer 130 in a case in which the etching method according to the comparative example was applied, which uses Ar gas as the rare gas, and line F illustrates the loss of the tungsten layer 130 in a case in which the etching method according to the present embodiment was applied, which uses He gas as the rare gas. The horizontal axis of FIG. 9 indicates an over etch target (%), and the vertical axis indicates a normalized amount of loss of the tungsten layer 130. In the present embodiment, the over etch target means a ratio of an etching time performed after the tungsten layer 130 is exposed to a period of time from a time when etching of the silicon oxide layer 140 is started to a time when the tungsten layer 130 is exposed, and the over etch target is expressed as a percentage. For example, 100% of the horizontal axis (over etch target) indicates that the etching time after the tungsten layer 130 is exposed is equal to a time required for etching the silicon oxide layer 140 until the tungsten layer 130 is exposed.

The tungsten layer 130 is bombarded with ions of noble gas from immediately after the tungsten layer 130 is exposed as a result of etching the silicon oxide layer 140, until a protective film is formed on the tungsten layer 130. However, as the protective film is formed almost instantaneously and its thickness varies transiently, it is not easy to accurately measure a rate of loss of the tungsten layer 130 during the period until the protective film is formed. Therefore, it is considered that the amount of loss of the tungsten layer 130 by ion bombardment is assumed to be a vertical intercept of the line E and the line F in FIG. 9.

In the graph of FIG. 9, an amount of loss of the tungsten layer 130 is defined as 1, in a case in which Ar gas is used as the noble gas and in which the over etch target is 0%. In a case in which Ar gas was used as the noble gas, the loss of the tungsten layer 130 increases, as the over etch target increases. For example, when the over etch target was 100%, the loss of the tungsten layer 130 increased by approximately 40%.

On the other hand, an amount of loss of the tungsten layer 130 due to ion bombardment when using He gas as the noble gas was lower than the comparative example in which Ar gas was used, and the amount of loss due to ion bombardment improved by 26%. In addition, when the over etch target is 100%, the amount of loss of the tungsten layer 130 slightly increased, and a loss rate of the tungsten layer 130 was improved by 82% compared to the comparative example in which Ar gas was used. The loss rate is indicated by slopes of the line E and the line F in FIG. 9.

According to the experimental results, when comparing the etching method according to the present embodiment with the etching method according to the comparative example under a condition in which the over etch target is 100%, the etching process according to the present embodiment using He gas was able to deposit polymers on the tungsten layer 130 thicker by 57% than in the comparative example using Ar gas.

Also, in the etching method according to the present embodiment, an amount of loss of the tungsten layer 130, when the over etch target was 100%, was reduced by 34% compared to the comparative example. In addition, the etching rate of the silicon oxide layer 140 in the etching method according to the present embodiment was only 7% lower than that of the comparative example. Therefore, in the etching method according to the present embodiment, selectivity of the silicon oxide layer 140 to the tungsten layer 130 was improved by 50% compared to the comparative example. Incidentally, in the etching method according to the present embodiment, the etching rate of the mask layer 100 of an organic film increased by 16% compared to the comparative example.

From the above-described experimental results, it has been found that the etching method according to the present embodiment in which He gas is used as the noble gas can improve the selectivity of the silicon oxide layer 140 to the tungsten layer 130 while maintaining the etching rate of the silicon oxide layer 140.

Figure 10:
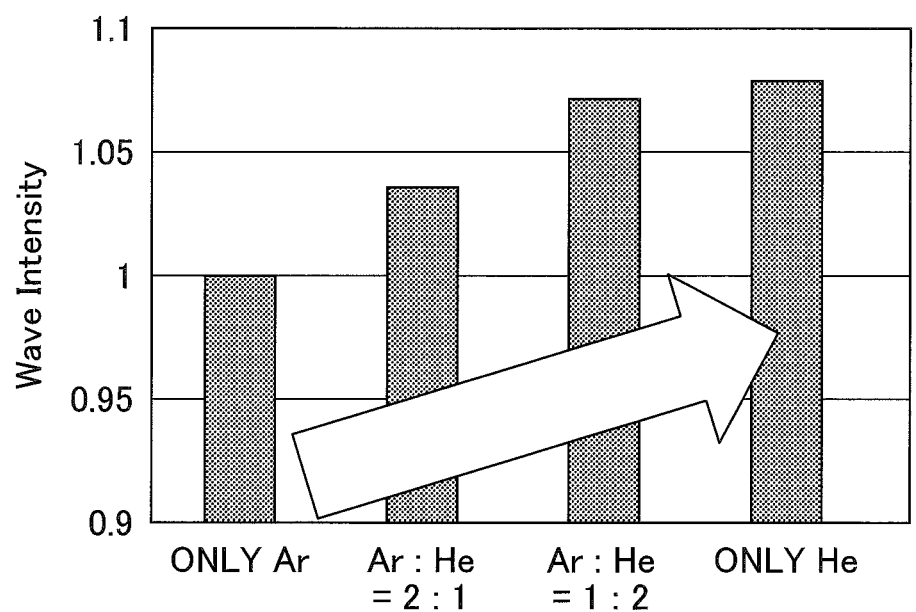
FIG. 10 is a diagram illustrating a relationship between a ratio of Ar gas to He gas and emission intensity of light of a wavelength corresponding to $CF_2$ radical.

Next, experimental results of measuring light emission intensity of CF radicals that are present in the plasma by changing a ratio of Ar gas to He gas will be described with reference to FIG. 10. FIG. 10 is a diagram illustrating a relationship between the ratio of Ar gas to He gas and the emission intensity of light of a wavelength corresponding to $CF_2$ radical.

The vertical axis of the bar graph in FIG. 10 indicates emission intensity of light of the wavelength corresponding to $CF_2$ radical, and each bar in FIG. 10 represents, from left to right, a case in which only Ar gas is used as the rare gas used in the etching method, a case in which a ratio of Ar gas to He gas is approximately 2:1, a case in which a ratio of Ar gas to He gas is approximately 1:2, and a case in which only He gas is used. In all the cases, a total flow rate of the noble gas was controlled to the same level. The emission intensities of light of the wavelength corresponding to $CF_2$ radical in the plasma were measured under the above-mentioned conditions.

As a result of the measurement, the emission intensity of light of the wavelength corresponding to $CF_2$ radical increased as the ratio of He gas to Ar gas increased, as illustrated in FIG. 10. Thus, it has been found that it is preferable to use He as the noble gas used in the etching method according to the present embodiment in order to promote high dissociation of a reactant gas such as fluorocarbon gas. In addition, it was found that the noble gas may not necessarily be a single gas of He, and that, by controlling the ratio of He gas to Ar gas, a degree of dissociation of $C_4F_6$ gas can be controlled to control a ratio between precursors with a high adsorption coefficient and precursors with a low adsorption coefficient. This can control an amount of precursors deposited on the upper surface or the side surface (opening) of the hole, and an amount or a ratio of precursors deposited on the bottom or a lower portion of the side surface of the hole.

For example, in a case in which the multilayered film illustrated in FIG. 1 is to be etched, the ratio of Ar gas to He gas may be controlled as follows. However, such an etching method is an example of controlling Ar gas and He gas, and is not limited thereto. As illustrated in FIG. 1, in the case in which each of the tungsten layers 130 is provided to different depths in the silicon oxide layer 140 such that the tungsten layers 130 form a series of steps, while etching of the silicon oxide layer 140 is performed until a tungsten layer 130 located at a shallow region is exposed, the etching may be performed at a higher etching rate by using only Ar gas as the noble gas, or by using, as the noble gas, a mixed gas of Ar gas and He gas in which a ratio of He gas to Ar gas is a first ratio. While etching the silicon oxide layer 140 to expose a tungsten layer 130 located at a deep region, a mixed gas of Ar gas and He gas, in which a ratio of He gas to Ar gas is a second ratio that is higher than the first ratio, may be used as the noble gas. Alternatively, a gas consisting of only He gas may be used as the noble gas. Because only Ar gas or a mixed gas having a high ratio of Ar gas to He gas is used while etching the shallow region, etching of the silicon oxide layer 140 is facilitated as compared to a case in which only He gas or a mixed gas having a high ratio of He gas to Ar gas is used. In addition, by using only Ar gas or a mixed gas having a high ratio of Ar gas to He gas, low dissociated precursors with a high adsorption coefficient are formed as compared to the case of using only He gas or a mixed gas having a high ratio of He gas to Ar gas, and the polymer 105 thickly deposited on the surface of the mask layer 100 acts as a protective film to increase selectivity of the silicon oxide layer 140 to the mask layer 100. Also, in a case in which the tungsten layer 1.30 is located in a shallow region, even the low dissociated precursors with the high adsorption coefficient can sufficiently be deposited on the exposed surface of the tungsten layer 130 to form the polymer 105 as a protective film. In contrast, when etching the silicon oxide layer 140 in the deep region, by using only He gas or a mixed gas having a high ratio of He gas to Ar gas or, loss of the tungsten layer 130 can be reduced without occluding an opening of a hole, rather than using only Ar gas or a mixed gas having a high ratio of Ar gas to He gas. That is, by controlling a ratio between Ar gas and He gas in the noble gas in accordance with etching depth (depth of a hole or a recess to be etched), the etching rate of the silicon oxide layer 140 and selectivity with respect to the tungsten layer 130 and the mask layer 100 can be balanced.

Alternatively, etching may be performed by repeating a step of using, as the noble gas, only Ar gas or a mixed gas in which a ratio of He gas to Ar gas is a first ratio, and a step of using, as the noble gas, only He gas or a mixed gas in which a ratio of He gas to Ar gas is a second ratio higher than the first ratio, at least once. In a step using only Ar gas or a mixed gas having a high ratio of Ar gas to He gas, low dissociated precursors with a high adsorption coefficient are formed, and the polymers 105 are thickly deposited on the surface of the mask layer 100. Thereafter, when a step of using only He gas or a mixed gas having a high ratio of He gas to Ar gas is performed, the deposited polymers 105 act as a protective film, and etching can be performed by increasing the selectivity of the silicon oxide layer 140 to the mask layer 100. That is, by repeatedly executing the different steps each of which uses the noble gas having a different ratio between Ar gas and He gas, the etching rate of the silicon oxide layer 140 and selectivity with respect to the tungsten layer 130 and the mask layer 100 can be balanced. At this time, in the step of using only Ar gas or a mixed gas having a high ratio of Ar gas to He gas, as the polymers 105 are deposited not only on the upper surface of the mask layer 100 but also on the side surface of the mask layer 100, it is desirable to adjust processing time or the like such that clogging of the opening of the hole does not occur.

In addition, controlling of the ratio between Ar gas and He gas in the noble gas in accordance with etching depth, and repeated execution of the different steps each of which uses the noble gas having a different ratio between Ar gas and He gas, may be combined. This can further balance the etching rate of the silicon oxide layer 140 and selectivity with respect to the tungsten layer 130 and the mask layer 100.

Ionization energy of Kr gas is "1350.8 (kJ/mol)", and ionization energy of Xe gas is "1170.4 (kJ/mol)", which are smaller than "1520.6 (kJ/mol)", which is ionization energy of Ar gas. Metastable level energy of Kr gas is 9.92 (eV), and metastable level energy of Xe gas is 8.32 (eV), which are smaller than 11.55 (eV), the metastable level energy of Ar gas. Therefore, if Kr gas or Xe gas is used as the noble gas instead of Ar gas, similar to the case of using Ar gas, low dissociated precursors with a high adsorption coefficient are generated to thickly deposit the polymer 105 on the surface of the mask layer 100 acting as a protective film, and selectivity of the silicon oxide layer 140 to the mask layer 100 is expected to increase.

<Momentum of Ionized Particle>

Behavior, effect, and experimental results of a case of using He, which has a higher ionization energy than Ar, as the first gas contained in the noble gas of the process gas in the etching method according to the present embodiment, have been described.

Next, the reason why the first gas needs to satisfy the condition that "momentum of an ionized particle of the first gas is less than momentum of an ionized particle of Ar gas" in addition to the condition that "the ionization energy is higher than that of Ar gas" will be explained.

When the tungsten layer 130 is exposed at the bottom surface of the hole, the tungsten layer 130 is bombarded with incident ions. In a case in which Ar gas is used as the noble gas, the surface of the tungsten layer 130 is bombarded with Ar ions. In a case in which He gas is used as the noble gas, the surface of the tungsten layer 130 is bombarded with He ions.

Sputtering is a physical reaction in which atoms composing a solid are released into space by momentum exchange when an accelerated particle strikes a surface of the solid. Sputtering yield represents the number of atoms released into space when an ion strikes a solid surface. That is, the sputtering yield of the solid surface when the accelerated ion strikes the solid surface is proportional to the momentum of the accelerated ion.

Figure 11:
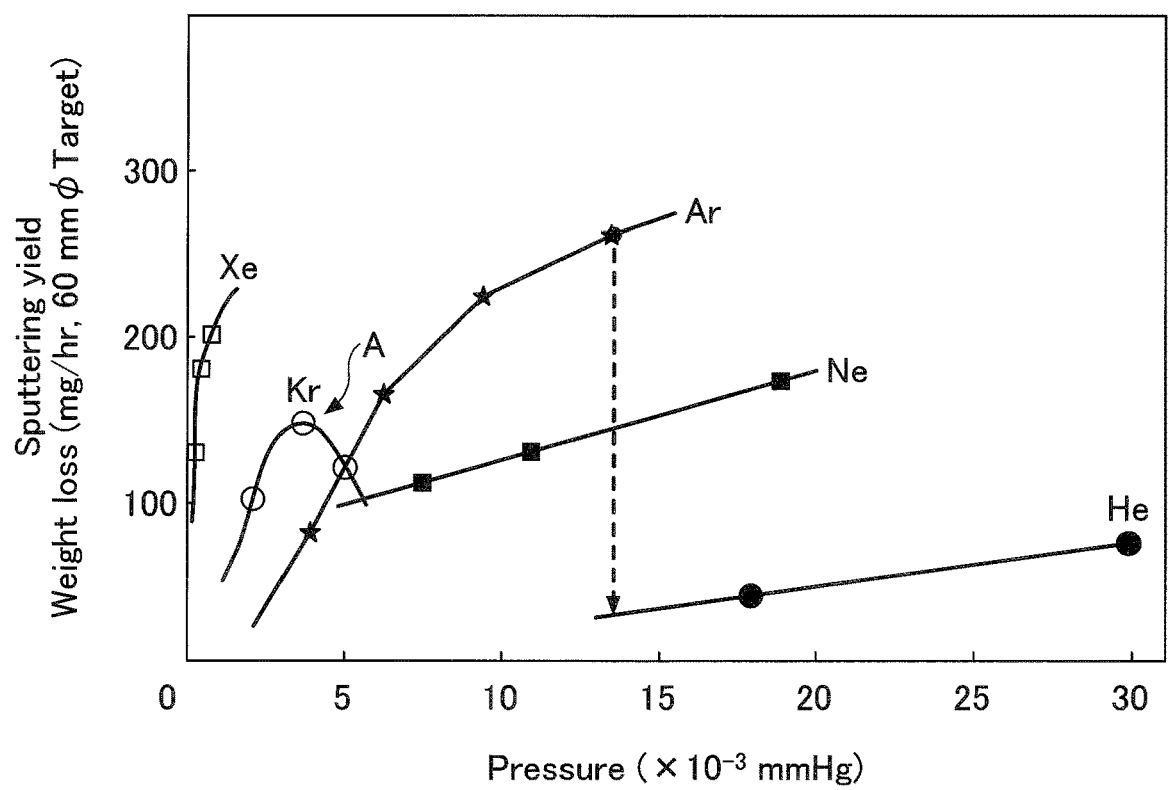
FIG. 11 is a diagram illustrating a relationship between pressure and sputtering yield for each gas type.

FIG. 11 is a diagram illustrating a relationship between pressure and sputtering yield for each gas type. The horizontal axis of FIG. 11 indicates pressure in the processing vessel, and the vertical axis indicates the sputtering yield. The source of FIG. 11 is "On the Behavior of the Sputtering using Various Kinds of Rare Gases under Radio-Frequency Plasma", written by Kanji Masui [Bulletin of Nagoya Institute of Technology, Vol. 50 (1998)].

In FIG. 11, the sputtering yield is expressed by loss of weight of a target having a diameter of 60 mm when ions are impacted on the target. According to FIG. 11, the sputtering yield of He is lower than the sputtering yield of Ar at a pressure of approximately $13 \times 10^{-3}$ (mmHg). Therefore, desorption of particle by ion bombardment is less likely to occur when using He gas, as compared to a case of using Ar gas. Thus, in a case in which He gas is used as the noble gas, the sputtering yield tends to be lower than in a case of using Ar gas.

Figure 12:
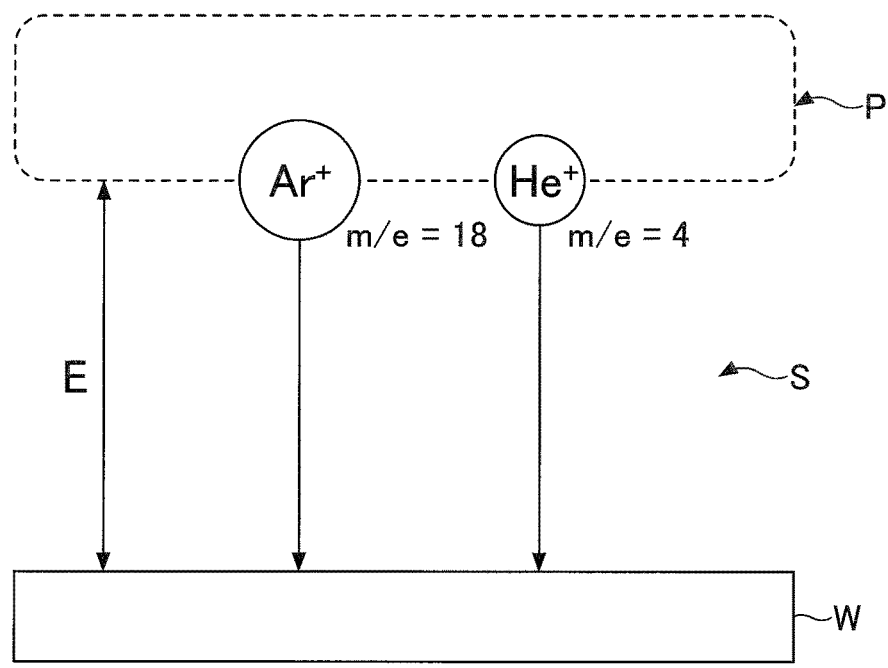
FIG. 12 is a diagram explaining momentum of ions.

A diagram for explaining momentum of ions is illustrated in FIG. 12. First, kinetic energy K of an ion in the plasma is expressed by Formula (1), where an amount of charge of the ion is q, potential difference between the plasma generation region P and the substrate W (sheath region S) is E, m is mass of the ion, and v is velocity of the ion.

$$K = \tfrac{1}{2} m v^2 = qE \qquad (1)$$

By rearranging Formula (1), Formula (2) is obtained.

$$v = \sqrt{\frac{2qE}{m}} \qquad (2)$$

A formula that expresses momentum P of the ion is expressed as the following Formula (3), by using the Formula (2).

$$P = mv = \sqrt{2qE} \cdot \sqrt{m} \qquad (3)$$

The mass of an atom of He ion is "4", which is smaller than the mass "18" of an atom of Ar ion. Accordingly, it can be found, from Formula (3), that the momentum of an atom of He ion is less than the momentum of an atom of Ar ion. Thus, if He gas is used, particles are less likely to be ejected from a surface of the tungsten layer 130 as compared to a case of using Ar gas, and He gas has an effect such that the sputtering yield of the tungsten layer 130 is lowered. When the tungsten layer 130 is exposed at the bottom of the hole, the surface of the tungsten layer 130 is bombarded with ions, and the sputtering yield of the tungsten layer 130 may increase temporarily. However, precursors of a CF-based gas are deposited on the surface of the tungsten layer 130 thereafter, and the deposited precursors act as a protective film. Therefore, it was found that an amount of loss of the tungsten layer 130 was suppressed.

In contrast, an etching rate is determined by interactions between surface adsorption of radicals and desorption caused by ion bombardment. Desorption by thermal energy also interacts with the desorption caused by ion bombardment and the surface adsorption of radicals. However, under an environment in which ions that are drawn into the substrate W by the radio frequency electric power LF are present, contribution of the desorption by thermal energy is lower than the desorption caused by ion bombardment, and the desorption by thermal energy is not considered here.

The etching rate is expressed by the following Formula (4). Note that the etching rate is denoted by "E/R" in Formula (4).

$$E/R = \frac{1}{n_C} \cdot \frac{1}{\frac{1}{kE_i \cdot \Gamma_{ion}} + \frac{1}{s \cdot \Gamma_{radical}}} = \frac{1}{n_C} \cdot \frac{[s \cdot \Gamma_{radical}] \times [kE_i \cdot \Gamma_{ion}]}{[s \cdot \Gamma_{radical}] + [kE_i \cdot \Gamma_{ion}]} \qquad (4)$$

In Formula (4), k is probability of ionic desorption, $E_i$ is ionization energy, $\Gamma_{ion}$ is an amount of incident ions, and $kE_i \cdot \Gamma_{ion}$ is the term representing "desorption by ion bombardment". The letter "s" in Formula (4) is probability of adsorption to the surface, $\Gamma_{radical}$ is a supply amount of radicals, and "$s \cdot \Gamma_{radical}$" is the term representing "surface adsorption of radicals". Note that "$n_c$" in Formula (4) indicates material of an etch target film.

The k (probability of ionic desorption) in Formula (4) is proportional to sputtering yield. Thus, the etching rate tends to increase if the sputtering yield is high, and tends to decrease if the sputtering yield is low. Thus, in a case in which He gas is used as the noble gas, the etching rate becomes lower than in a case in which Ar gas is used because the sputtering yield becomes lower than in the case in which Ar gas is used.

However, by using He gas as the noble gas, fluorocarbon gas is highly dissociated, and precursors with a low adsorption coefficient are generated. This increases $\Gamma_{ion}$ (an amount of incident ions) because radicals serving as etchant are provided to the bottom of hole H. This is considered to be a reason that the etching rate was maintained even if He gas is used as the noble gas.

As described above, in order to suppress loss of the tungsten layer 130 and increase selectivity of the silicon oxide layer 140 to the tungsten layer 130, it has been found that it is important to have precursors arrive on the tungsten layer 130 at the bottom of the hole and to reduce momentum of ions. Accordingly, in the etching method according to the present embodiment, the noble gas contained in the process gas is changed from Ar gas to He gas. This can improve the selectivity of the silicon oxide layer 140 to the tungsten layer 130 while maintaining the etching rate of the silicon oxide layer 140.

<Etching Method>

Next, the etching method according to the present embodiment will be described with reference to FIG. 13 and FIGS. 14A to 14C. FIG. 13 is a flowchart illustrating the etching method according to the present embodiment. FIGS. 14A to 14C are diagrams for explaining the etching method according to the present embodiment. The etching method is performed in the substrate processing apparatus 1 of FIG. 2, and is controlled by the controller 70 of FIG. 2.

When the etching method is started, a substrate W on which a multilayered film is formed is loaded into the processing vessel 2, and is placed on the lower electrode (mounting table) 21 (step S1). In the multilayered film, the tungsten layer 130, the silicon oxide layer 140, and the mask layer 100 are layered in this order.

Next, the process gas, which contains fluorocarbon gas ($C_xF_y$ gas), such as $C_4F_6$ gas, and He gas, is supplied into the processing vessel 2 (step S2). Next, the radio frequency electric power HF and LF are applied from the first radio frequency power supply 32 and the second radio frequency power supply 34 respectively, to generate a plasma (step S3). After the multilayered film is etched (step S4), the etching method terminates.

In the etching method according to the present embodiment, fluorocarbon gas in the process gas, such as $C_4F_6$ gas, is highly dissociated while the multilayered film is etched, as illustrated in FIG. 14A. Then, the silicon oxide layer 140 is etched by precursors such as $CF_2$ radicals, $CF_3$ radicals, $CF_2$ ions, and $CF_3^+$ ions, and by He ions. Note that precursors are denoted by "$CF_x$" or "$CF_x^+$" in the drawings.

At this time, precursors are deposited at the bottom of the recess etched in the silicon oxide layer 140. However, at the same time, by interaction with He ions, the precursors are consumed as etchant for etching the silicon oxide layer 140, and change to a volatile gas such as $SiF_4$ and CO; therefore, polymers as deposits are not formed.

As illustrated in FIG. 14B, when the etching of the silicon oxide layer 140 is completed and the tungsten layer 130 is exposed, the precursors are not consumed as etchant, and begin to be deposited as polymers. However, immediately after the etching of the silicon oxide layer 140 is completed, as the polymers are not deposited on the exposed surface of the tungsten layer 130, the surface of the tungsten layer 130 is bombarded mainly with He ions, which causes loss of the tungsten layer 130 (see the portion indicated by an arrow G).

Thereafter, as illustrated in FIG. 14C, as the etching continues, the etching rate of the tungsten layer 130 decreases because the precursors are deposited as polymers on the surface of the tungsten layer 130 and act as a protective film (see the portion indicated by an arrow I).

As described above, in the etching method according to the present embodiment, selectivity of the etch target film with respect to the undercoat layer can be improved.

<Metastable Level Energy of Noble Gas>

It is preferable that energy in a metastable state of the first gas used in the etching method according to the present embodiment is greater than energy in a metastable state of Ar gas. For example, the metastable level energy of He gas is "19.82 (eV)", which is higher than "11.55 (eV)" which is the metastable level energy of Ar gas. Ne gas also has greater metastable level energy of "16.62 (eV)" than Ar, and a mixture of He gas and Ne gas also has greater metastable level energy than Ar gas. During the etching process, the noble gas is excited to the metastable state by interaction with the plasma. When a normal atom or molecule is excited, average time (lifetime of spontaneous emission) that the atom or molecule emits energy, such as light, and spontaneously transits to the ground state, is in an order of microseconds or less. Because the lifetime of spontaneous emission in a metastable state is in an order of 1 second, a large amount of noble gas in the metastable state having high energy can be present in the plasma generation space. The noble gas in the metastable state emits energy by collision, and transits to the ground state.

Therefore, in a case in which the noble gas used is He gas or Ne gas having a greater metastable level energy than Ar gas, a large amount of noble gas having a high metastable state of energy is present in the plasma generation space. Therefore, as the noble gas such as He gas or Ne gas collides with the fluorocarbon gas such as the $C_4F_6$ gas in the plasma generation space and the sheath region S, the fluorocarbon gas can be highly dissociated.

Accordingly, in the etching method according to the present embodiment, as He gas is used, polymers having a higher adsorption coefficient decrease and polymers having a lower adsorption coefficient increase, as compared to a case of using Ar gas. Therefore, it is possible to improve the selectivity of the etch target film to the undercoat layer by supplying a large amount of polymers to the undercoat layer while suppressing occurrence of clogging of an opening of a hole formed by etching.

The etching method and the substrate processing apparatus according to the present embodiment disclosed herein are to be considered exemplary in all respects and not limiting. The above embodiments may be modified and enhanced in various forms without departing from the appended claims and spirit thereof. Matters described in the above embodiments may take other configurations to an extent not inconsistent, and may be combined to an extent not inconsistent.

The substrate processing apparatus according to the present disclosure is applicable to any type of etching processing apparatus, such as a capacitively coupled plasma (CCP) type, an inductively coupled plasma (ICP) type, a radial line slot antenna type, an electron cyclotron resonance plasma (ECR) type, and a helicon wave plasma (HWP) type.

What is claimed is:

1. A method comprising:
   loading, into a process chamber, a substrate on which a multilayered film is foiined, the multilayered film including (i) a silicon-containing insulating layer, (ii) undercoat layers provided in the silicon-containing insulating layer, the undercoat layers being respectively located at different depths, and (iii) a mask layer provided on the silicon- containing insulating layer;
   supplying a first process gas into the process chamber, the first process gas containing a fluorocarbon gas and a second noble gas;
   forming a plasma from the first process gas in the process chamber, thereby causing the multilayered film to be etched to a first depth at which a first undercoat layer among the undercoat layers is located;
   after causing the multilayered film to be etched to the first depth, changing the second noble gas to a first noble gas to supply a second process gas into the process chamber, the second process gas containing the fluorocarbon gas and the first noble gas; and
   forming a plasma from the second process gas in the process chamber, thereby causing the multilayered film to be etched to a second depth at which a second undercoat layer among the undercoat layers is located, the second depth being deeper than the first depth; wherein
   the first noble gas has higher ionization energy than Ar gas,
   momentum of an ionized particle of the first noble gas is less than momentum of an ionized particle of Ar gas, and
   the second noble gas contains Ar gas or a gas having lower ionization energy than Ar gas.

2. The method according to claim 1, wherein energy in a metastable state of the first gas is greater than energy in a metastable state of Ar gas.

3. The method according to claim 1, wherein the first noble gas contains at least one of He gas and Ne gas.

4. The method according to claim 1, wherein the gas having lower ionization energy than Ar gas is Kr gas or Xe gas.

5. The method according to claim 1, wherein the fluorocarbon gas is at least one of $C_4F_6$ gas, $C_4F_8$ gas, $C_3F_8$ gas, $C_6F_6$ gas, and $C_5F_8$ gas.

6. The method according to claim 1, wherein the silicon-containing insulating layer is a silicon oxide layer.

7. The method according to claim 1, wherein each undercoat layer is a conductive layer.

8. The method according to claim 7, wherein the conductive layer is a metal layer or a silicon layer.

9. The method according to claim 8, wherein the conductive layer is formed of tungsten.

10. The method according to claim 3, wherein the silicon-containing insulating layer is a silicon oxide layer, and each undercoat layer is a silicon nitride layer.

11. The method according to claim 1, wherein the silicon-containing insulating layer is a silicon oxide layer or a Low-k film layer, and each undercoat layer is a silicon carbide layer or a silicon carbide/nitride layer.

12. The method according to claim 1, wherein causing multilayered film to be etched to the second depth includes supplying first precursors in the plasma formed from the second process gas, such that an amount of the first precursors is relatively greater than an amount of second precursors, the second precursors having high dissociation and low adsorption coefficient in comparison to the first precursors.

\* \* \* \* \*